United States Patent
Kang et al.

(10) Patent No.: US 9,219,251 B2
(45) Date of Patent: Dec. 22, 2015

(54) ORGANIC LIGHT EMITTING DISPLAY APPARATUS

(71) Applicant: Samsung Display Co., Ltd., Yongin, Gyeonggi-Do (KR)

(72) Inventors: Seock-Hwan Kang, Yongin (KR); Jae-Kyoung Kim, Yongin (KR); Min-Woo Kim, Yongin (KR); Il-Nam Kim, Yongin (KR); Sung-Kook Park, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/288,617

(22) Filed: May 28, 2014

(65) Prior Publication Data

US 2015/0194634 A1 Jul. 9, 2015

(30) Foreign Application Priority Data

Jan. 7, 2014 (KR) ........................ 10-2014-0002086

(51) Int. Cl.
  *H01L 51/52* (2006.01)
  *H01L 27/32* (2006.01)

(52) U.S. Cl.
  CPC ........ *H01L 51/5268* (2013.01); *H01L 27/3213* (2013.01); *H01L 51/5275* (2013.01); *H01L 2251/5323* (2013.01)

(58) Field of Classification Search
  CPC ............ H01L 27/3234; H01L 27/3262; H01L 27/1222; H01L 27/1259; H01L 51/5268; H01L 51/5275; H01L 51/5262; H01L 27/3211; H01L 27/3213

USPC .......... 257/59, 72, 80, 40, E27.121, E27.119, 257/88; 438/23, 151; 359/599
See application file for complete search history.

(56) References Cited

U.S. PATENT DOCUMENTS

| 7,969,655 B2 * | 6/2011 | Chang ........................... 359/599 |
| 2004/0217702 A1 * | 11/2004 | Garner ................ H01L 51/5262 313/512 |
| 2008/0174875 A1 * | 7/2008 | Iwata .................... G02B 5/0215 359/599 |
| 2011/0147770 A1 | 6/2011 | Hwang et al. |
| 2011/0205198 A1 | 8/2011 | Jeong et al. |
| 2012/0074435 A1 * | 3/2012 | Ha ....................... H01L 51/5203 257/88 |
| 2012/0080680 A1 | 4/2012 | Choi et al. |
| 2012/0169683 A1 | 7/2012 | Hong |

(Continued)

FOREIGN PATENT DOCUMENTS

| KR | 1020110071446 A | 6/2011 |
| KR | 1020110097046 A | 8/2011 |

(Continued)

*Primary Examiner* — Kenneth Parker
*Assistant Examiner* — Young W Kim
(74) *Attorney, Agent, or Firm* — Cantor Colburn LLP

(57) ABSTRACT

An organic light emitting display apparatus includes a substrate divided into a first light emission region, and a transmission region adjacent to the first light emission and through which an external light is transmitted, an organic light emitting device on the substrate and in the first light emission region, and including a pixel electrode, an intermediate layer on the pixel electrode and including an organic light emission layer, and an opposite electrode on the intermediate layer; and a light scattering layer on the substrate and in the transmission region, and configured to scatter a light incident thereto from the intermediate layer in the first light emission region.

20 Claims, 7 Drawing Sheets

(56) References Cited

U.S. PATENT DOCUMENTS

2012/0267611 A1* 10/2012 Chung ............... H01L 27/3211
                                                              257/40
2012/0305966 A1* 12/2012 Shin ............................... 257/98

FOREIGN PATENT DOCUMENTS

| KR | 1020120031365 A | 4/2012 |
| KR | 1020120035039 A | 4/2012 |
| KR | 1020120079318 A | 7/2012 |

* cited by examiner

ORGANIC LIGHT EMITTING DISPLAY APPARATUS

This application claims priority to Korean Patent Application No. 10-2014-0002086, filed on Jan. 7, 2014, and all the benefits accruing therefrom under 35 U.S.C. §119, the disclosure of which is incorporated herein in its entirety by reference.

BACKGROUND

1. Field

One or more embodiment of the invention relates to an organic light emitting display apparatus.

2. Description of the Related Art

An organic light emitting display apparatus includes an organic light emitting device including an organic light emission layer disposed between hole and electron injection electrodes, and is a self light emitting type display device in which excitons created when holes injected from the hole injection electrode and electrons injected from the electron electrode are combined in the organic light emission layer decay from excited states to a ground state and generate light.

As a self light emitting type display device, since not needing a separate light source, the organic light emitting display apparatus may be driven in a relatively low voltage and configured to be relatively light in weight and thin in overall thickness. In addition, since the organic light emitting display apparatus has excellent characteristics in such as a viewing angle, contrast and a response speed, an application area thereof is being enlarged from a personal mobile device such as an MP3 player or a mobile phone, to a television ("TV") set.

SUMMARY

One or more embodiment of the invention includes an organic light emitting display apparatus.

Additional features will be set forth in part in the description which follows and, in part, will be apparent from the description, or may be learned by practice of the presented embodiments.

According to one or more embodiment of the invention, an organic light emitting display apparatus includes: a substrate divided into a first light emission region, and a transmission region adjacent to the first light emission region and through which an external light is transmitted; an organic light emitting device on the substrate and in the first light emission region, and including a pixel electrode, an intermediate layer on the pixel electrode and including an organic light emission layer, and an opposite electrode on the intermediate layer; and a light scattering layer on the substrate and in the transmission region, and configured to scatter a light incident thereto from the intermediate layer.

The organic light emitting display apparatus may further includes a pixel defining layer in the transmission region and extended from an end portion of the pixel electrode, and configured to transmit a light incident thereto.

A transmission window may be defined in the transmission region, and the opposite electrode and the pixel defining layer are not disposed in the transmission window.

The light scattering layer may be disposed in the transmission window.

The light scattering layer may include scattering particles having a size of about 1 micrometer (µm) or smaller.

A width of the light scattering layer may be greater than a height thereof.

The light scattering layer may scatter light incident to a side surface thereof and may transmit a light incident to a top or bottom surface thereof.

The light scattering layer may include two layers having different refractive indexes.

The light scattering layer may include bumps on the top or bottom surface thereof.

The light scattering layer may include bumps on the top and bottom surfaces thereof, and periods of the bumps on the top and bottom surfaces thereof are different from each other.

The period of the bumps may be about 1 µm or smaller.

The pixel electrode may be a reflective electrode, and the opposite electrode may be a transparent or translucent electrode.

The organic light emitting display apparatus may further include a second light emission region adjacent to the first light emission region and a third light emission region adjacent to the second light emission region. The first to third light emission regions emit different color lights, and the transmission window may be adjacent to a same side of the first, second and third light emission regions.

The organic light emitting display apparatus may further include a reflective member at a side of the transmission window which is not adjacent to the first to third light emission regions.

The pixel electrode and the opposite electrode may be reflective electrodes.

The organic light emitting display apparatus may further include second, third and fourth light emission regions separated from the first light emission region, and the transmission window may include four sides respectively adjacent to the first to fourth light emission regions.

The transmission window may have a square shape.

The first and second light emission regions may respectively emit red and green lights, and the third and fourth light emission regions may emit blue lights having the same wavelength.

The first and second light emission regions may respectively emit red and green lights, and the third and fourth light emission regions may emit blue lights having different wavelengths.

The organic light emitting display apparatus may further include a pixel circuit unit electrically connected to and driving the organic light emitting device, and overlapped with the first light emission region, in a plan view.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
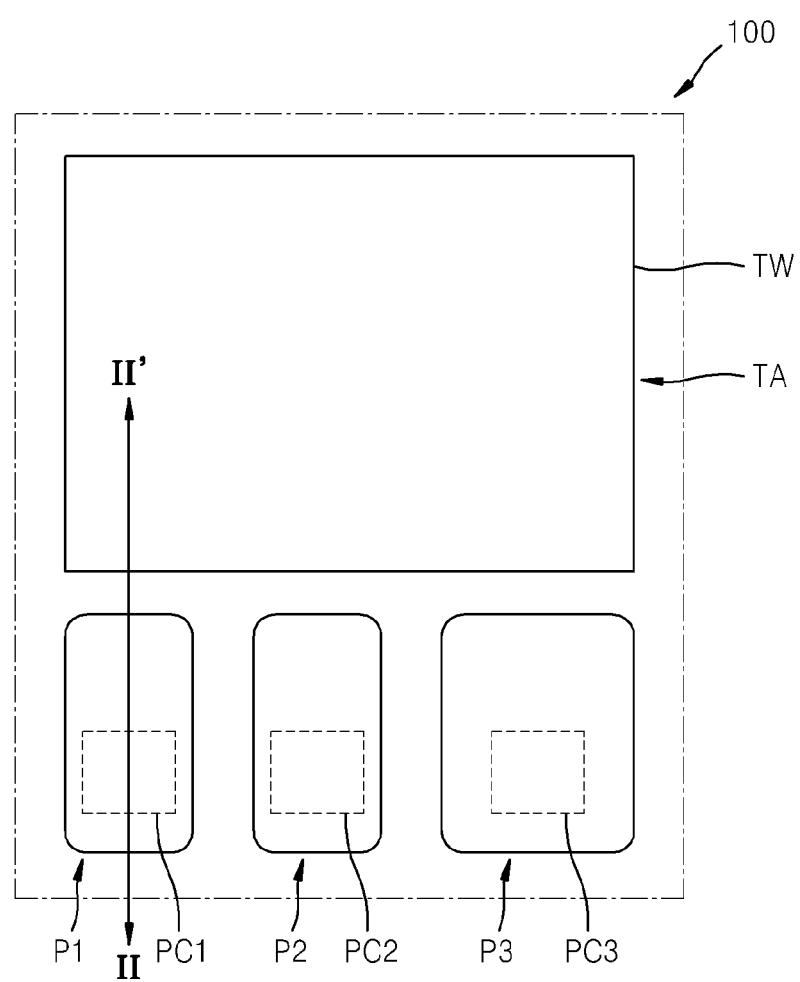
FIG. 1 is a plan view schematically illustrating an embodiment of an organic light emitting display apparatus according to the invention.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain features of the invention.

As used herein, the term "and/or" includes any and all combinations of one or more of the associated listed items. Expressions such as "at least one of," when preceding a list of elements, modify the entire list of elements and do not modify the individual elements of the list.

Hereinafter, the embodiments of the invention will now be described in detail with reference to the accompanying drawings, in which like numbers refer to like elements throughout, and a repetitive explanation will be omitted.

It will be understood that although the terms "first," "second," etc. may be used herein to describe various components, these components should not be limited by these terms. These components are only used to distinguish one component from another.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on," another layer, region, or component, it can be directly or indirectly on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Figure 2:
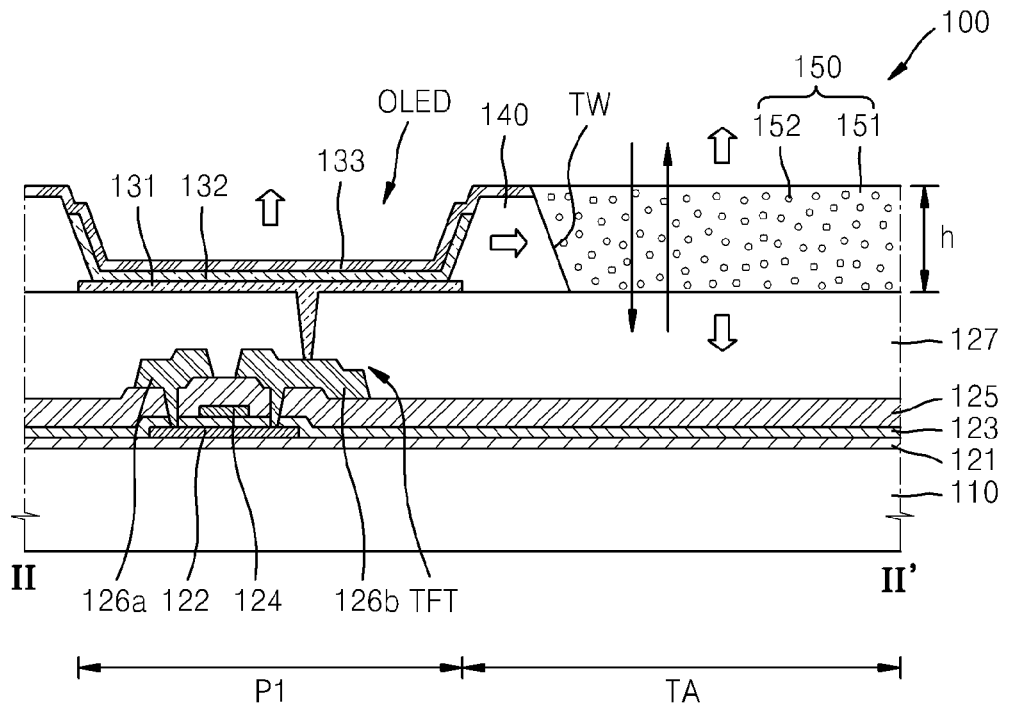
FIG. 2 is a cross-sectional view taken along line II-II' of FIG. 1.

FIG. 1 is a plan view schematically illustrating an embodiment of an organic light emitting display apparatus according to the invention, and FIG. 2 is a cross-sectional view taken along line II-II' of FIG. 1.

Referring to FIGS. 1 and 2, the organic light emitting display apparatus 100 includes a substrate 110 divided into a first light emission region P1, and a transmission region TA disposed adjacent to the first light emission region P1 and allowing an external light to be transmitted therethrough. An organic light emitting device ("OLED") including a pixel electrode 131, an intermediate layer 132 including an organic light emission layer, and an opposite electrode 133 is disposed in the first light emission region P1 defined on the substrate 110. A light scattering layer 150 configured to scatter a light incident from the intermediate layer 132 is disposed in the transmission region TA.

A pixel defining layer 140 that is extended from an end portion of the pixel electrode 131 is disposed in the transmission region TA. A transmission window TW may be defined in the transmission region TA and in which the opposite electrode 133 and the pixel defining layer 140 are not disposed. The transmission window W portion of the transmission region TA may have a higher transmittance than that of a remaining portion of the transmission region TA.

The substrate 110 may further include first and second light emission regions P2 and P3 defined thereon. The second light emission region P2 may be disposed on a region adjacent to the first light emission region P1, and the third light emission region P3 may be disposed on a region adjacent to the second light emission region P2. The transmission window TW may be disposed to be extended to a region adjacent to the second and third light emission regions P2 and P3 from a region adjacent to the first light emission region P1.

The first to third light emission regions P1 to P3 respectively may emit different color lights.

The pixel electrode 131 may include a reflective layer. In an embodiment, for example, the reflective layer may include at least one selected from silver (Ag), magnesium (Mg), aluminum (Al), platinum (Pt), palladium (Pd), gold (Au), nickel (Ni), neodymium (Nd), iridium (Ir) and chromium (Cr). On the reflective layer of the pixel electrode 131, a transparent or translucent electrode layer may be further disposed. The transparent or translucent electrode layer may include at least one selected from indium tin oxide ("ITO"), indium zinc oxide ("IZO"), zinc oxide ("ZnO"), indium oxide ("$In_2O_3$"), indium gallium oxide ("IGO") and aluminum zinc oxide ("AZO").

In an embodiment, for example, the pixel electrode 131 may include three layers such as ITO/Ag/ITO, and a reflectivity thereof may be increased by the silver layer having a cross-sectional thickness of about 1000 angstroms (A) or greater.

The intermediate layer 132 includes an organic light emission layer, and may further include at least one of a hole injection layer ("HIL"), a hole transport layer ("HTL"), an electron transport layer ("ETL") and an electron injection layer ("EIL"). However, the invention is not limited thereto. The intermediate layer 132 may include an organic light emission layer and further include other various functional layers.

The intermediate layers 132 included in the first, second and third light emission regions P1, P2 and P3 may respectively emit red, green and blue lights. In another embodiment, for example, the intermediate layers 132 included in the first, second and third light emission regions P1, P2 and P3 may all emit white lights. When the light emission regions P1, P2 and P3 all emit the white lights, the organic light emitting display apparatus 100 may further include a color converting layer and/or a color filter (not shown) converting a white light into a predetermined color light.

The intermediate layer 132 emitting a white light may have various structures, for example, a structure in which light emitting materials respectively emitting at least a red light, a green light and a blue light are stacked in a multi-layer structure.

As another example for emitting a white light, the intermediate layer 132 may include a structure in which light emitting materials emitting at least red, green and blue lights are mixed.

The blue, green and red lights are just an example, and the invention is not limited thereto. That is, when a white light is emitted, a combination of various colors other than the combination of the red, green and blue colors may be used.

The opposite electrode 133 may include a transparent or translucent electrode, include one or more materials selected from among silver (Ag), aluminum (Al), magnesium (Mg), lithium (Li), calcium (Ca), copper (Cu), LiF/Ca, LiF/Al, MgAg, and CaAg. The opposite electrode 133 may have a thin film shape having a cross-sectional thickness of several nanometers (nm) to tens of nm.

A part of the light emitted from the organic light emission layer included in the intermediate layer 132 is emitted in a direction of the opposite electrode 133 directly, or by being reflected by the pixel electrode 131 as indicated by the upward pointing arrow in FIG. 2. Another part of the emitted light, such as a remaining portion thereof, may propagate in a side direction of the intermediate layer 132 as indicated by the rightward pointing arrow in FIG. 2.

The light propagating in the side direction of the intermediate layer 132 may pass through the pixel defining layer 140, which includes a light transmission material, and be incident to the light scattering layer 150.

The light scattering layer 150 may include light scattering particles 152 having a size of about 1 micrometer (μm) or smaller, which are dispersed in a transparent medium 151.

The scattering particles 152 may have approximately the same size as a wavelength of an incident light so that Mie scattering occurs for the incident light. The concentration of the scattering particles 152 is relatively very low and a width of the light scattering layer 150 in the top plan view may be greater than a height 'h' of the light scattering layer 150.

Accordingly, a light incident to the light scattering layer 150 from the outside of the organic light emitting display apparatus 100 may be minimally scattered and pass through the light scattering layer 150 to be transmitted in a direction opposite that that of the incident direction. External light incident from above or below the organic light emitting display apparatus 100 may be minimally scattered and pass through the light scattering layer 150 to be transmitted in a direction opposite that that of the incident direction, as illustrated by the thin black line upward and downward pointing arrows in FIG. 2.

However, light incident from the side surface of the light scattering layer 150 is scattered by the scattering particles 152, while propagating over a relatively long distance along a width direction of the light scattering layer 150, and propagates in directions toward a top surface and/or a bottom surface of the light scattering layer 150 to be emitted externally as indicated by the upward and downward pointing arrows above and below the light scattering layer 150 in FIG. 2.

The pixel defining layer 140 may include a material having a reflectivity between that of the organic light emission layer included in the intermediate layer 132 and that of the transparent medium 151 included in the light scattering layer 150 in order to efficiently deliver the light emitted from the intermediate layer 132 to the light scattering layer 150. In addition, although not shown in the drawing, the pixel defining layer 140 may include a light waveguide having various shapes for delivering the light emitted from the intermediate layer 132 to the light scattering layer 150.

Due to the above-described configuration, an image may be realized in the transmission region TA as well as the light emission regions P1, P2 and P3 by releasing the light emitted in the side direction of the intermediate layer 132 while maintaining transparency of the organic light emitting display apparatus 100.

That is, light extraction efficiency of the organic light emitting display apparatus 100 can be improved by using the side surface light which is not emitted externally and is typically lost, and contrast of an image with respect to a background image, namely, an external light transmitted through the organic light emitting display device 100 can be increased by realizing the image even in the transmission region TA.

Dual emission can be realized without increase of pixels, since light is released in both sides of the organic light emitting display apparatus 100 by the light scattering layer 150 which is disposed on the transmission region TA.

Since a light incident to the light scattering layer 150 is scattered and emitted externally in various angles, a color shift phenomenon in which a wavelength of the emitted light becomes different according to the viewing angle, can be reduced.

The organic light emitting display apparatus 100 of the invention, may further include pixel circuit units PC1, PC2 and PC3 electrically connected to the organic light emitting device OLED and driving the organic light emitting device OLED. The pixel circuit units PC1, PC2 and PC3 may be disposed on an overlapped region with the light emission regions P1, P2 and P3 in the top plan view.

The pixel circuit units PC1, PC2 and PC3 may include a thin film transistor ("TFT").

The pixel circuit units PC1, PC2 and PC3 are disposed on the region overlapped with the light emission regions P1, P2 and P3, respectively, such that a separate space in which the pixel circuit units PC1, PC2 and PC3 are disposed is obviated, and high resolution can be easily realized. In addition, since the pixel circuit units PC1, PC2 and PC3 are not disposed on a region corresponding to the transmission region TA, transparency of the organic light emitting display apparatus 100 can be increased.

Referring to FIG. 2, a first insulating layer 121 may be disposed on the substrate 110. The substrate 110 may include a glass or a plastic. A TFT including an active layer 122, a gate electrode 124, a source electrode 126a and a drain electrode 126b may be disposed on the first insulating layer 121.

A second insulating layer 123 may be disposed between the active layer 122 and the gate electrode 124, and a third insulating layer 125 may be disposed between the gate electrode 124, and the source and drain electrodes 126a and 126b.

A fourth insulating layer 127 may be disposed on the third insulating layer 125 to cover the source and drain electrodes 126a and 126b. The fourth insulating layer 127 may be configured to planarize the underlying layers, and may include an organic material.

The organic light emitting device OLED, the pixel defining layer 140 and the light scattering layer 150 may be disposed on the fourth insulating layer 127.

The substrate 110, and the first to fourth insulating layers 121, 123, 125 and 127 may include a transparent material, and accordingly the transparency of the organic light emitting display apparatus 100 can be increased and a light scattered from the light scattering layer 150 can be transmitted.

Figure 3:
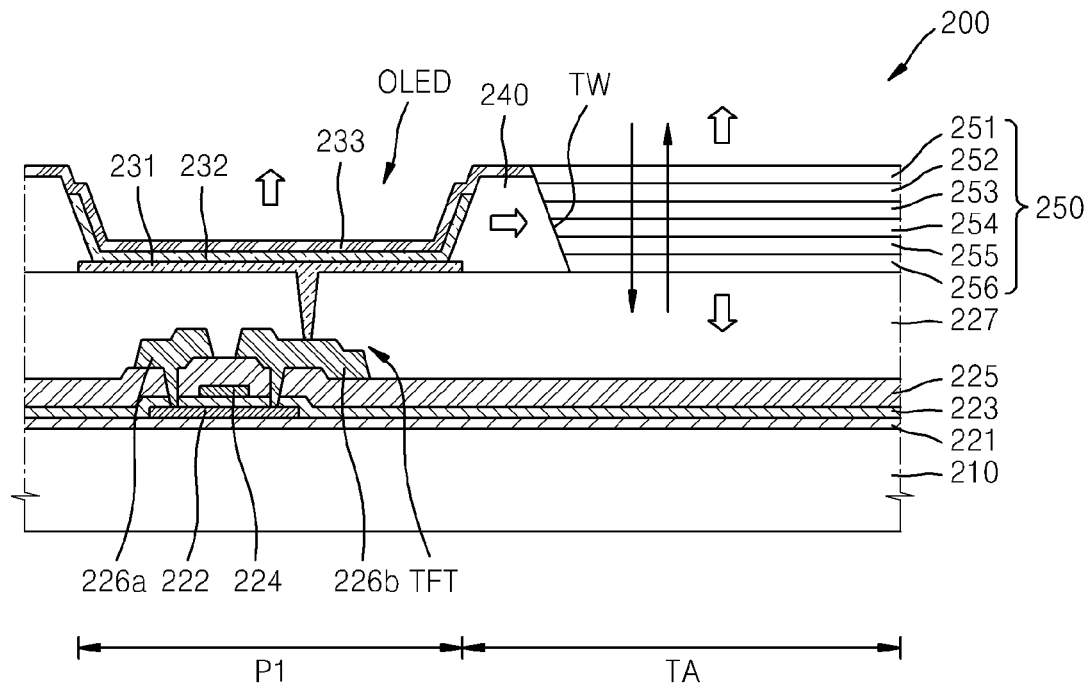
FIG. 3 is a cross-sectional view schematically illustrating another embodiment of an organic light emitting display apparatus according to the invention.

FIG. 3 is a cross-sectional view schematically illustrating another embodiment of an organic light emitting display apparatus according to the invention.

Referring to FIG. 3, the organic light emitting display apparatus 200 includes a substrate 210 divided into a first light emission region P1, and a transmission region TA disposed adjacent to a first light emission region P1 and allowing an external light to be transmitted therethrough. An OLED including a pixel electrode 231, an intermediate layer 232 including an organic light emission layer, and an opposite electrode 233 are disposed in the first light emission region P1 defined on the substrate 210. A light scattering layer 250 configured to scatter a light incident from the intermediate layer 232 is disposed in the transmission region TA.

A pixel defining layer 240 that is extended from an end portion of the pixel electrode 231 is disposed in the transmission region TA. The transmission region TA may include a transmission window TW in which the opposite electrode 233 and the pixel defining layer 240 are not disposed. The transmission window TW portion of the transmission region TA may have a higher transmittance than that of a remaining portion of the transmission region TA.

The pixel defining layer 240 includes a transparent material and may be configured to deliver a light emitted from the intermediate layer 232 to the light scattering layer 250.

The light scattering layer 250 may scatter light incident from side surface of the light scattering layer 250, transmit a light incident in a top or bottom surface direction of the light scattering layer 250, and include two layers having different refractive indexes.

Referring to FIG. 3, the light scattering layer 250 includes six layers 251, 252, 253, 254, 255 and 256, and the six layers 251, 252, 253, 254, 255 and 256 may include high refractive index layers 252, 254 and 256 and low refractive index layers 251, 253 and 255 which are alternatively disposed.

The high refractive index layers 252, 254 and 256 within a group of high refractive index layers and the low refractive index layers 251, 253 and 255 within a group of low refractive index layers, may respectively include an identical material or different materials.

When a light is incident from the high refractive index layers 252, 254 and 256 to the low refractive index layers 251, 253 and 255, total reflection may occur where a total reflection condition is satisfied, namely, an incident angle of the incident light is a predetermined value or greater.

Accordingly, a light incident from the outside of the organic light emitting display device 200 to the light scattering layer 250 is not reflected on boundary surfaces of the high refractive index layers 252, 254 and 256 and low refractive index layers 251, 253 and 255 and is transmitted without a change, since an incident angle of the incident light is not relatively large. A light incident from the intermediate layer 232 to the light scattering layer 250 propagates along a width direction of the light scattering layer 250. A part of the light the light emitted from the organic light emission layer included in the intermediate layer 232 is reflected on the boundary surfaces of the high refractive index layers 252, 254 and 256 and low refractive index layers 251, 253 and 255 and emitted outside of the light scattering layer 150, and the other part of the light such as a remaining portion thereof is transmitted, since the incident angle of the incident light is relatively large.

Due to the above-described configuration, while transparency of the organic light emitting display apparatus 200 is maintained, a light emitted towards a side direction of the intermediate layer 232 may be released externally in up, down and/or side directions by the light scattering layer 250 disposed in the transmission region TA.

Reference numerals shown in FIG. 3 represent a first insulating layer 221, a second insulating layer 223, a third insulating layer 225, a fourth insulating layer 227, an active layer 222, a gate electrode 224, a source electrode 226a, and a drain electrode 226b of a thin film transistor TFT.

Figure 4:
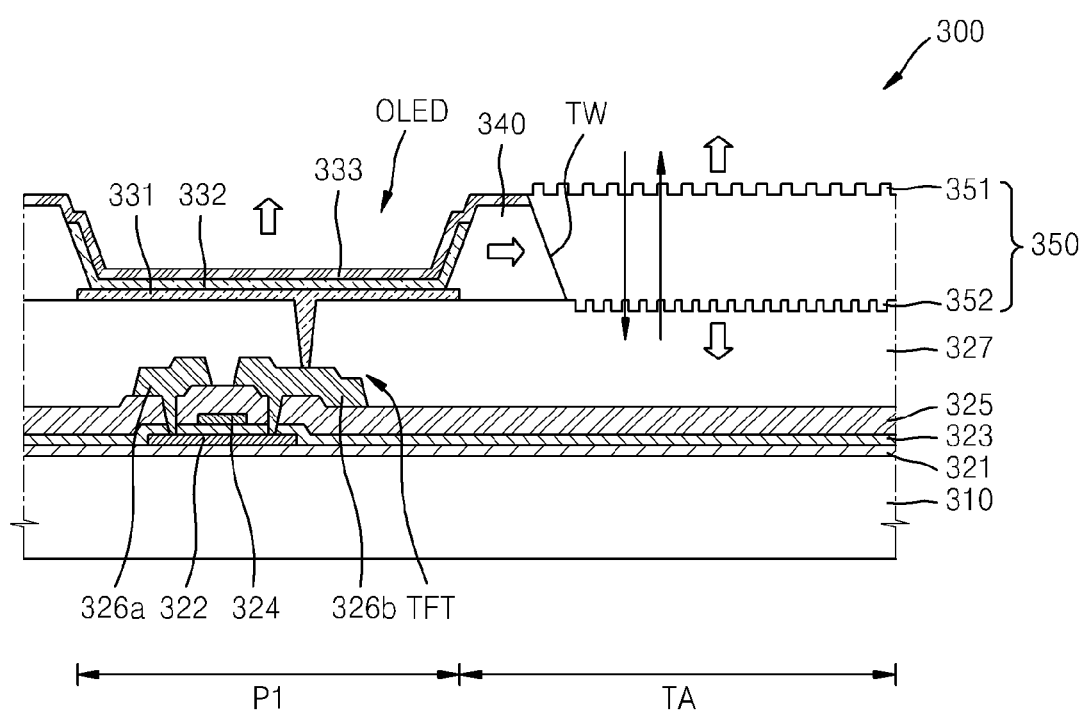
FIG. 4 is a cross-sectional view schematically illustrating still another embodiment of an organic light emitting display apparatus according to the invention.

FIG. 4 is a cross-sectional view schematically illustrating still another embodiment of an organic light emitting display apparatus according to the invention.

Referring to FIG. 4, the organic light emitting display apparatus 300 includes a substrate 310 divided into a first light emission layer P1, and a transmission region TA disposed adjacent to the first light emission layer P1 and having an external light transmitted therethrough. An organic light emitting device OLED including a pixel electrode 331, an intermediate layer 332 including an organic light emission layer 332, and an opposite electrode 333 are disposed in the first light emission region P1 defined on the substrate 310. A light scattering layer 350 configured to scatter a light incident from the intermediate layer 332 is disposed in the transmission region TA.

A pixel defining layer 340 that is extended from an end portion of the pixel electrode 331 is disposed in the transmission region TA. The transmission region TA may include a transmission window TW in which the opposite electrode 333 and the pixel defining layer 340 are not disposed. The transmission window TW portion of the transmission region TA may have higher transmittance than that of a remaining portion of the transmission region TA.

The pixel defining layer 340 may include a transparent material, and may be configured to deliver a light emitted from the intermediate 332 to the light scattering layer 350.

The light scattering layer 350 may include bumps 351 and 352 disposed on the top and bottom surfaces of the light scattering layer 350. The bumps 351 and 352 may be defined by recesses defined in the top and bottom surfaces of the light scattering layer 350, or the bumps 351 and 352 may be defined by protruded portions of the light scattering layer 350 extended from a common top and bottom surface of the light scattering layer 350.

The bumps 351 and 352 may have a size, a period and a shape adjusted to transmit a light incident from the outside of the organic light emitting display apparatus 300 to the light scattering layer 350 and scatter a light incident from the intermediate layer 332. The period of the bumps 351 and 352 may be about 1 μm or smaller. The period may be defined as a distance taken between adjacent bumps with reference to a same location or point of the respective bumps.

Since a degree of scattering of the bumps 351 and 352 may differ by a difference between refractive indexes of materials disposed on the top and bottom portions of the bumps 351 and 352, a period of the bumps 351 disposed on the top surface of the light scattering layer 350 and a period of the bumps 352 disposed on the bottom surface of the light scattering layer 350 may be different from each other.

The shape of the bumps 351 and 351 of FIG. 4 is exemplary, and the invention is not limited thereto. The bumps 351 and 352 may have various shapes, such as a lens shape, a triangle shape as well as a rectangular shape (FIG. 4). In an embodiment, the bumps 351 and 352 may be disposed only on the top surface or on the bottom surface instead of both top and bottom surfaces of the light scattering layer 350.

Due to the above-described configuration, while transparency of the organic light emitting display apparatus 300 is maintained, a light emitted towards a side direction of the intermediate layer 332 may be released externally by the light scattering layer 350 disposed in the transmission region TA.

Reference numerals shown in FIG. 4 represent a first insulating layer 321, a second insulating layer 323, a third insulating layer 325, a fourth insulating layer 327, an active layer 322, a gate electrode 324, a source electrode 326a, and a drain electrode 326b of a thin film transistor TFT.

Figure 5:
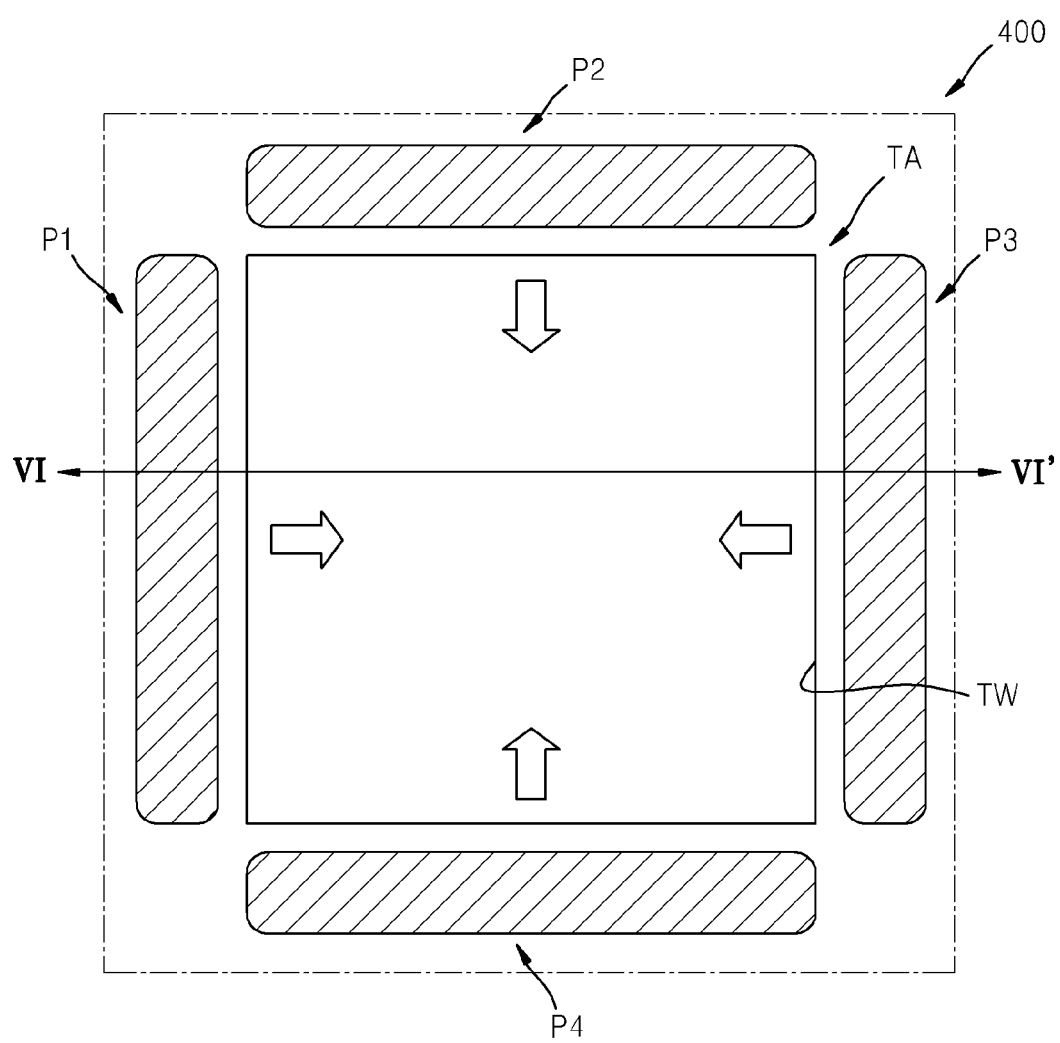
FIG. 5 is a top plan view schematically illustrating yet another embodiment of an organic light emitting display apparatus according to the invention.

FIG. 5 is a top plan view schematically illustrating yet another embodiment of an organic light emitting display apparatus according to the invention.

Referring to FIG. 5, the organic light emitting display apparatus includes a first light emission region P1, a second light emission region P2 disposed separate from the first light emission region P1, a third light emission region P3 and a fourth light emission region P4. A transmission region TA may be disposed in an area defined by the light emission regions P1, P2, P3 and P4, such as between opposing light emission regions.

The transmission region TA may include a transmission window TW at a portion of the transmission region TA having a higher transmittance than that a remaining portion of the transmission region TA. In the plan view, the transmission region TW may include four sides respectively disposed adjacent to the first to fourth light emission regions P1 to P4, respectively.

The first to fourth light emission regions P1 to P4 may respectively emit lights of various colors to realize a white light by combination of the emitted lights.

In an embodiment, for example, the first to fourth light emission regions P1 to P4 may respectively emit a red light, a green light, a blue light and a blue light. The third and fourth light emission regions P3 and P4 may emit the blue lights having an identical wavelength or different wavelengths.

A life of the blue light emission region, which is relatively short, may be increased by configuring the third and fourth light emission regions P3 and P4 to emit the blue light having the identical wavelength.

In an embodiment, a function of a bio-clock may be added to the organic light emitting display apparatus by configuring the third light emission region P3 to emit a blue light having a wavelength range proper to realizing an image and the fourth light emission region P4 to emit a blue light having a different wavelength from that of the third light emission region P3 and having a function of recovering biorhythm.

The lights emitted from the light emission regions P1 to P4 may all be incident to the transmission window TW as indicated by the arrows pointing toward the transmission window TW from the various light emission regions, and then released towards the both sides of the organic light emitting display apparatus 400 by the light scattering layer 450 (see FIG. 6) disposed on the transmission window TW. That is, the lights emitted from the light emission regions P1 to P4 are mixed to be released outside the organic light emitting display apparatus 400 through one window.

The transmission window TW may have a square shape of which lengths of the four sides are substantially identical.

When the light is transmitted through the transmission window TW, a diffraction phenomenon may occur at each side of the transmission region TW. With the diffraction phenomenon, an image may be distorted by the superimposition of lights diffracted at each side.

However, when lengths of sides of the transmission region TW are configured to be identical, the light diffracted at each side may have an identical pattern and accordingly the phenomenon that the image is distorted due to the superimposition of the diffracted lights may be reduced.

Figure 6:
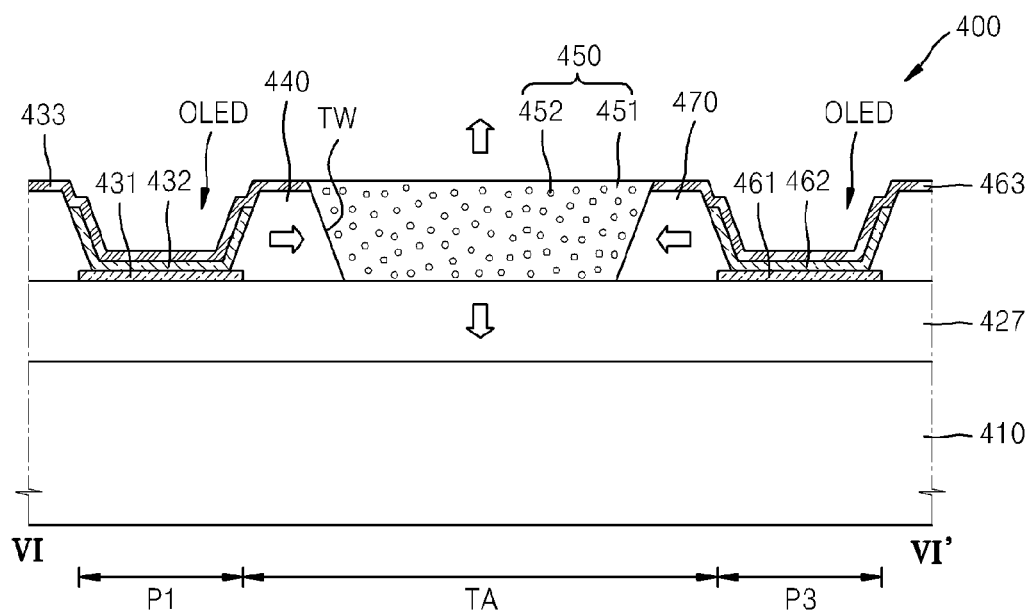
FIG. 6 is a cross-sectional view taken along line VI-VI' of FIG. 5.
Figure 7:
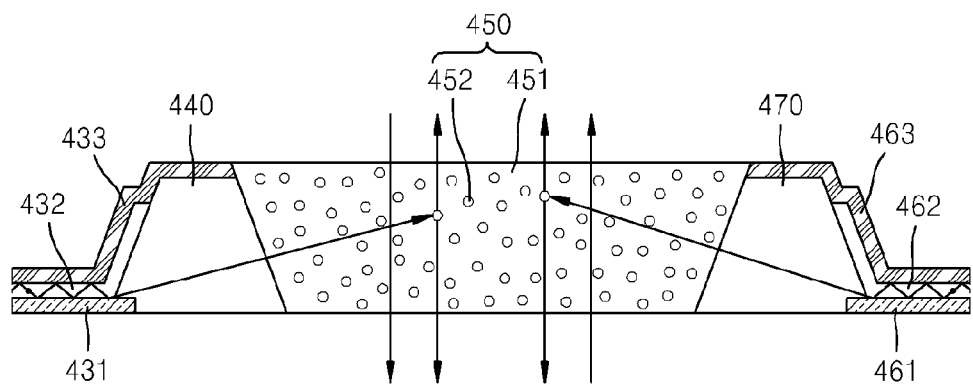
FIG. 7 is a conceptual view illustrating a light extracting principle of the organic light emitting display apparatus of FIG. 5.

FIG. 6 is a cross-sectional view taken along line VI-VI' of FIG. 5, and FIG. 7 is a conceptual view representing a light extraction principle of the organic light emitting display apparatus of FIG. 5.

Referring to FIGS. 6 and 7, a substrate 410 is divided into the first and third light emission regions P1 and P3, the transmission region TA is disposed between the first and third light emission regions P1 and P3. An organic light emitting device OLED including pixel electrodes 431 and 461, intermediate layers 432 and 462 including organic light emission layers, and opposite electrodes 433 and 463 are disposed in the first and third light emission regions P1 and P3 defined on the substrate 410. The light scattering layer 450 configured to scatter lights incident from the intermediate layers 432 and 462 may be disposed in the transmission region TA.

Pixel defining layers 440 and 470 that are extended from end portions of the pixel electrodes 431 and 461 are disposed in the transmission region TA. The transmission region TA may include a transmission window TW in which the opposite electrodes 433 and 463, and the pixel defining layers 440 and 470 are not disposed. The transmission window TW region of the transmission are TA may have larger transmittance than that of a remaining portion of the transmission region TA.

The pixel defining layers 440 and 470 include transparent material and are configured to deliver lights emitted from the intermediate layers 432 and 462, to the light scattering layer 450.

A pixel driving unit (not shown) and an insulating layer 427 may be disposed between the substrate 410 and the OLED. Although not shown in the drawing, a black matrix (not shown) may be disposed on a region corresponding to the pixel electrodes 431 and 461, on the substrate 410.

The pixel electrodes 431 and 461 may respectively include reflective layers. In an embodiment, for example, the reflective layer may include at least one selected from silver (Ag), magnesium (Mg), aluminum (Al), platinum (Pt), palladium (Pd), gold (Au), nickel (Ni), neodymium (Nd), iridium (Ir) and chromium (Cr). On the reflective layer, a transparent or a translucent electrode layer may be further disposed and may include at least one selected from ITO, IZO, ZnO, $In_2O_3$, IGO and AZO.

The intermediate layers 432 and 462 include the organic light emission layers and may further include at least one of a HIL, a HTL, an ETL and an EIL. However, the invention is not limited thereto. The intermediate layers 432 and 462 may include the organic light emission layers and further include other various functional layers. The organic light emission layer may emit a red, green, blue and/or white light.

The opposite electrodes 433 and 463 may include reflective layers, and the reflective layers may include at least one selected from silver(Ag), aluminum(Al), magnesium(Mg), lithium(Li), calcium(Ca), copper(Cu), LiF/Ca, LiF/Al, MgAg and CaAg.

Since the embodiment of the organic light emitting display apparatus 400 includes the pixel electrode 431 and 461 and the opposite electrodes 433 and 463 all including the reflective layers, lights are not released in directions of the pixel electrodes 431 and 461 or in directions of the opposite electrodes 433 and 463. That is, an optical waveguide is effectively formed by the pixel electrode 431 and 461 and the opposite electrodes 433 and 463 including the reflective layers, and lights emitted from the intermediate layers 432 and 462 may propagate in side directions, namely, towards the transmission region TA.

Lights which are emitted from the intermediate layers 432 and 462 and propagate towards the side surfaces, are incident to the transparent pixel defining layers 440 and 470, and transmitted through the pixel defining layers 440 and 470 to be incident to the light scattering layer 450.

The light scattering layer 450 in the illustrated embodiment may include light scattering particles 452 having a size of about 1 μm or smaller, which are dispersed in a transparent medium 451.

The light scattering particles 452 may have approximately the same size as a wavelength of an incident light so that Mie scattering occurs for the incident light.

A light incident to the light scattering layer 450 from the outside of the organic light emitting display apparatus 400 is minimally scattered and passes through the light scattering layer 450 to be transmitted in an opposite direction to the incident direction.

However, lights incident from the side surfaces of the light scattering layer 450 may propagate along a width direction of the light scattering layer 450, be scattered by the scattering particles 452 to propagate towards directions of the top surface and/or the bottom surface of the light scattering layer 450, and then released externally.

Due to the above-described configuration, an image may be realized in the transmission region TA by externally releasing the light emitted in the direction of the side surfaces of the intermediate layers 432 and 462 by means of the light scattering layer 450 disposed on the transmission region TA, while maintaining transparency of the organic light emitting display apparatus 400.

Referring FIG. 5 again, in the organic light emitting display apparatus 400 of the illustrated embodiment, lights are not released externally from the light emission regions P1, P2, P3 and P4, but are only released toward the transmission region TA.

Accordingly, when the area of the transmission region TA is increased, transparency of the organic light emitting display apparatus 400 can be increased. Since lights emitted from the light emission regions P1, P2, P3 and P4 are mixed and released from the transmission region TA, continuity and visibility of the colors of a realized image can be improved.

In addition, by increasing an area that the transmission region TA occupies in the organic light emitting display apparatus 400, optical members, such as a polarizer for preventing reflection of an external light can be omitted, and thereby increasing transparency of the organic light emitting display apparatus 400.

Figure 8:
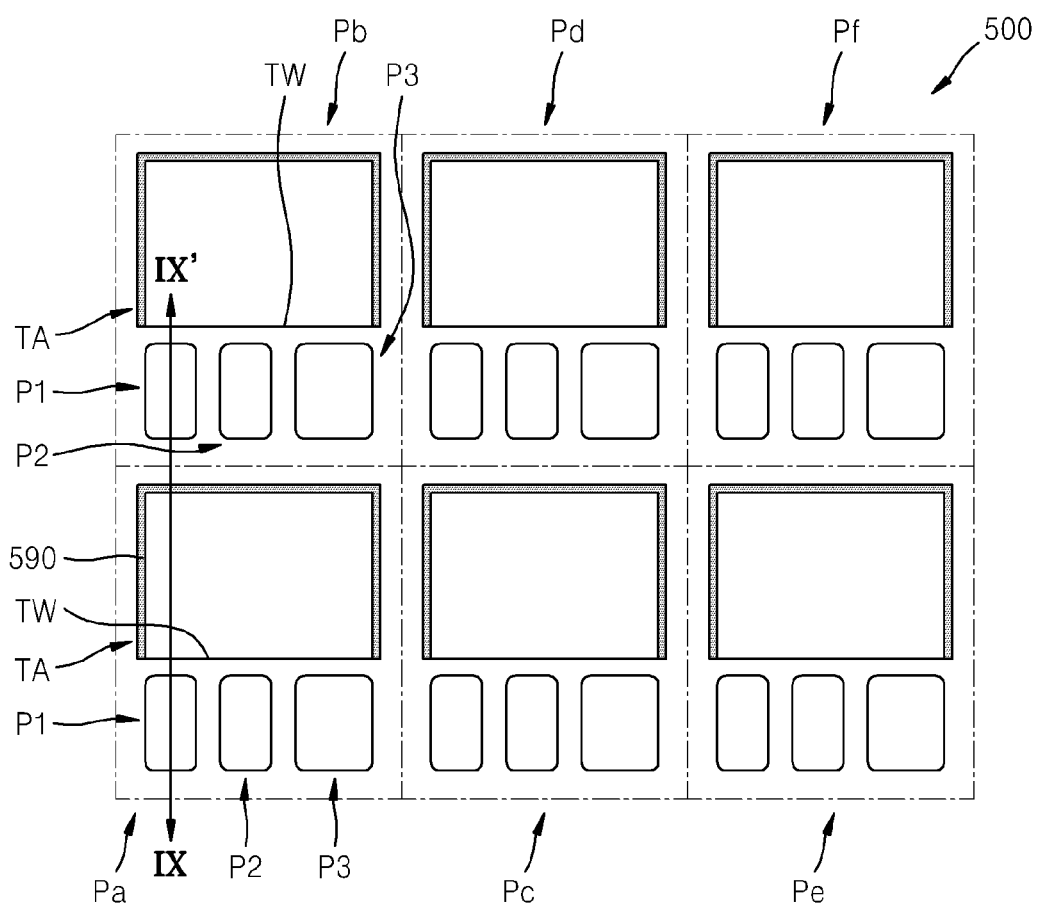
FIG. 8 is a top plan view schematically illustrating yet another embodiment of an organic light emitting display apparatus according to the invention.
Figure 9:
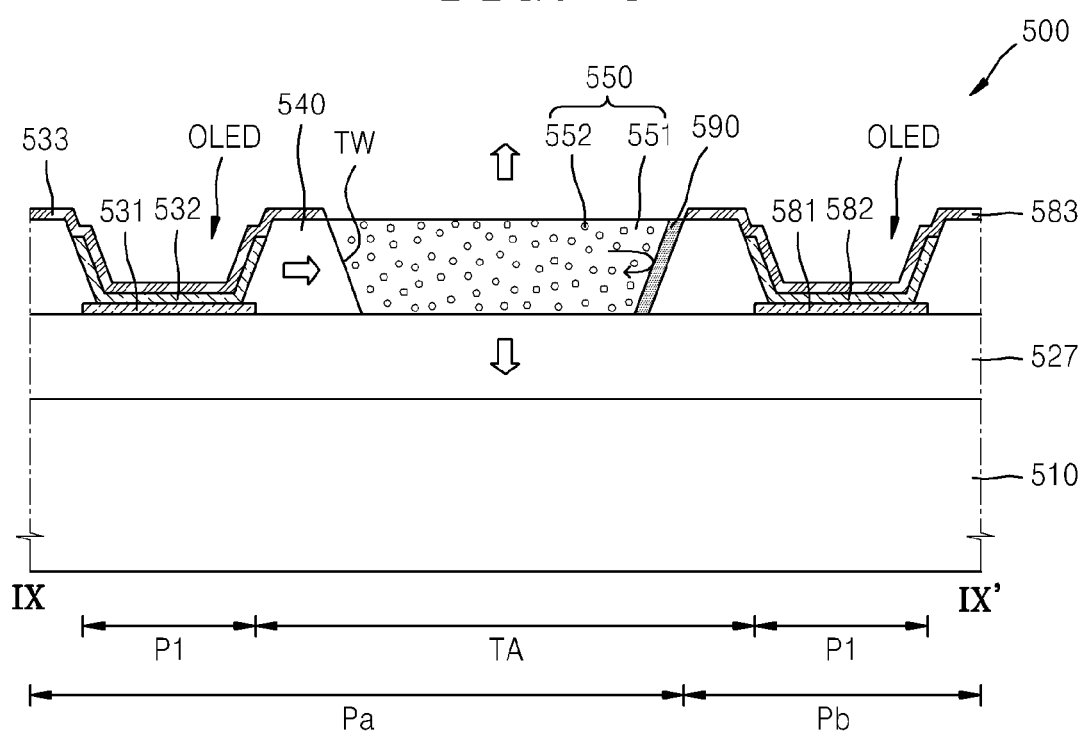
FIG. 9 is a cross-sectional view taken along line IX-IX' of FIG. 8.

FIG. 8 is a top plan view schematically illustrating yet another embodiment of an organic light emitting display device according to the invention, and FIG. 9 is a cross-sectional view taken along line IX-IX' of FIG. 8.

Referring to FIG. 8, the organic light emitting display device 500 includes a plurality of pixels Pa, Pb, Pc, Pd, Pe and Pf. Each of the plurality of pixels Pa, Pb, Pc, Pd, Pe and Pf may include a first light emission region P1, a second light emission region P2, a third light emission region P3 and a transmission region TA through which an external light is transmitted.

The transmission region TA includes a transmission window TW. The transmission window TW region of the transmission are TA has a larger transmittance than that of a remaining region of the transmission region TA. Regions of the transmission window TW, which are not adjacent to the first to fourth light emission regions P1 to P4, may include reflective members 590.

Each of the plurality of pixels Pa to Pf may include a pixel circuit unit (not shown) which is independently driven, such that the pixels emit or not emit a light of a specific color for realizing a desired image in the transmission region TA. A pixel that does not emit a light may be transparent.

That is, in order for the organic light emitting display apparatus 500 to realize a desired image, a light emitted from each of the plurality of pixels Pa to Pf is required not to affect other pixels.

However, lights emitted from the intermediate layers 532 and 582 (see FIG. 9) and propagated towards the side surfaces thereof propagate to other adjacent pixels, and allow other pixels to emit lights, which are required not to emit the lights, or to emit lights of undesired colors.

The organic light emitting display apparatus 500 of the illustrated embodiment may have the reflective members 590 disposed on a region of the transmission region TW of each of the plurality of pixels Pa to Pf.

Referring to FIG. 9, a substrate 510, which is divided into a first pixel Pa including a first light emission region P1 and a transmission region TA, and a second pixel Pb disposed adjacent to the first pixel Pa and including the first light emission region P1.

An organic light emitting device OLED is disposed in the first light emission region P1 of the first pixel Pa and includes a pixel electrode 531, the intermediate 532 and an opposite electrode 533. A light scattering layer 550 is disposed in a transmission window TW included in the transmission region TA and includes transparent medium 551, and light scattering particles 552 disposed in the first pixel Pa, on the substrate 510. A pixel defining layer 540 including a transparent material may be disposed between the intermediate layer 532 and the transmission window TW.

A pixel driving unit (not shown) and an insulating layer 527 may be disposed between the substrate 510 and the OLEDs. Although not shown in the drawing, a black matrix (not shown) may be disposed on a region corresponding to the pixel electrodes 531 and 581, on the substrate 510.

An organic light emitting device OLED disposed in the first light emission region P1 and including a pixel electrode 581, the intermediate layer 582 and an opposite electrode 583 may be disposed in the second pixel Pb, on the substrate 510.

A reflective member 590 may be disposed in a region of the transmission window TW included in the first pixel Pa, and adjacent to the second pixel Pb. Accordingly, a light emitted from the intermediate layer 532 included in the first pixel Pa and propagated towards the side surfaces of the intermediate layer 532 is transmitted through the light scattering layer 550 and reflected by the reflective member 590, does not propagate to the second pixel Pb and is re-incident to the light scattering layer 550.

Due to the above-described configuration, a phenomenon that lights are mixed between adjacent pixels can be reduced or effectively prevented and light extraction efficiency can be increased by re-scattering a light reflected by the reflective member 590 to release the light externally.

The embodiments of the organic light emitting display apparatuses 100, 200, 300, 400 and 500 of invention improve light extraction efficiency by using side-traveling lights emitted from the intermediate layers 132, 232, 332, 432, 462, 532, and 582 including organic light emission layers, in image display within a transmission region TA adjacent to the intermediate layers. Lights from the intermediate layers and from an outside are then released from the transmission region TA, which allows an external light to be transmitted, and increases contrast of an image realized in the organic light emitting display apparatuses 100, 200, 300, 400 and 500 with respect to a background image.

Furthermore, since light is scattered by the light scattering layers 150, 250, 350, 450 and 550 disposed in the transmission region TA and released externally, a color shift phenomenon in side viewing angles is improved and dual emission display apparatus can be realized without increase of pixels within the organic light emitting display apparatuses 100, 200, 300, 400 and 500.

It should be understood that the embodiments described herein should be considered in a descriptive sense only and not for purposes of limitation. Descriptions of features within each embodiment should typically be considered as available for other similar features in other embodiments.

While one or more embodiment of the invention has been described with reference to the figures, it will be understood by those of ordinary skill in the art that various changes in form and details may be made therein without departing from the spirit and scope of the invention as defined by the following claims.

What is claimed is:

1. An organic light emitting display apparatus comprising:
   a substrate divided into a first light emission region, and a transmission region adjacent to the first light emission region and through which an external light is transmitted;
   an organic light emitting device on the substrate and in the first light emission region, the organic light emitting device comprising a pixel electrode, an intermediate layer on the pixel electrode and comprising an organic light emission layer, and an opposite electrode on the intermediate layer comprising the organic light emission layer; and
   a light scattering layer on the substrate and in the transmission region,
   wherein in a plan view, the light scattering layer which is in the transmission region is disposed non-overlapped with the pixel electrode of the organic light emitting device to scatter a light incident thereto from the intermediate layer which is in the first light emission region.

2. The organic light emitting display apparatus of claim 1, further comprising a pixel defining layer in the transmission region and extended from an end portion of the pixel electrode, and configured to transmit light incident thereto.

3. The organic light emitting display apparatus of claim 2, wherein
   a transmission window is defined in the transmission region, and
   the pixel defining layer in the transmission region, and the opposite electrode are not disposed in the transmission window.

4. The organic light emitting display apparatus of claim 3, wherein the light scattering layer in the transmission region is disposed in the transmission window.

5. The organic light emitting display apparatus of claim 1, wherein the light scattering layer comprises light scattering particles having a size of about 1 micrometer or smaller.

6. The organic light emitting display apparatus of claim 5, wherein a width of the light scattering layer in thee plan view, is greater than a cross-sectional height thereof.

7. The organic light emitting display apparatus of claim 1, wherein the light scattering layer scatters light incident to a side surface thereof, and transmits a light incident to a top or bottom surface thereof.

8. The organic light emitting display apparatus of claim 7, wherein the light scattering layer comprises two layers having different refractive indexes.

9. The organic light emitting display apparatus of claim 1, wherein the light scattering layer comprises bumps on a top or bottom surface thereof.

10. The organic light emitting display apparatus of claim 9, wherein
    the light scattering layer comprises bumps on the top and bottom surfaces thereof, and periods of the bumps on the top and bottom surfaces thereof are different from each other.

11. The organic light emitting display apparatus of claim 9, wherein the period of the bumps is about 1 micrometer or smaller.

12. The organic light emitting display apparatus of claim 1, wherein
    the pixel electrode is a reflective electrode, and
    the opposite electrode is a transparent or translucent electrode.

13. The organic light emitting display apparatus of claim 3, further comprising
    a second light emission region adjacent to the first light emission region, and
    a third light emission region adjacent to the second light emission region,
    wherein
    the first to third light emission regions emit different color lights, and
    the transmission window is adjacent to a same side of the first, second and third light emission regions.

14. The organic light emitting display apparatus of claim 13, further comprising a reflective member at a side of the transmission window which is not adjacent to the first to third light emission regions.

15. The organic light emitting display apparatus of claim 1, wherein the pixel electrode and the opposite electrode are reflective electrodes.

16. The organic light emitting display apparatus of claim 1, further comprising a pixel circuit unit electrically connected to and driving the organic light emitting device, and overlapped with the first light emission region in a plan view.

17. An organic light emitting display apparatus comprising:
- a substrate divided into a first light emission region and a transmission region adjacent to the first light emission region and through which an external light is transmitted;
- an organic light emitting device on the substrate and in the first light emission region, the organic light emitting device comprising a pixel electrode, an intermediate layer on the pixel electrode and comprising an organic light emission layer, and an opposite electrode on the intermediate layer m emission layer;
- a light scattering layer on the substrate and in the transmission region to scatter a light incident thereto from the intermediate layer which is in the first light emission region;
- a pixel defining layer in the transmission region and extended from an end portion of the pixel electrode, and configured to transmit light incident thereto; and second, third and fourth light emission regions separated from the first light emission region,
wherein a transmission window is defined in the transmission region, the transmission window comprising four sides respectively adjacent to the first to fourth light emission regions.

18. The organic light emitting display apparatus of claim 17, wherein the transmission window has a square shape in a plan view.

19. The organic light emitting display apparatus of claim 17, wherein
the first and second light emission regions respectively emit red and green lights, and
the third and fourth light emission regions emit blue lights having the same wavelength.

20. The organic light emitting display apparatus of claim 17, wherein
the first and second light emission regions respectively emit red and green lights, and
the third and fourth light emission regions emit blue lights having different wavelengths.

* * * * *